US 7,516,267 B2

(12) United States Patent
Coulson et al.

(10) Patent No.: US 7,516,267 B2
(45) Date of Patent: Apr. 7, 2009

(54) RECOVERING FROM A NON-VOLATILE MEMORY FAILURE

(75) Inventors: Richard L. Coulson, Portland, OR (US); Sanjeev N. Trika, Hillsboro, OR (US); Robert W. Faber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 350 days.

(21) Appl. No.: 11/266,119

(22) Filed: Nov. 3, 2005

(65) Prior Publication Data
US 2007/0168698 A1 Jul. 19, 2007

(51) Int. Cl.
*G06F 12/16* (2006.01)

(52) U.S. Cl. ............... 711/103; 711/154; 714/2; 714/15

(58) Field of Classification Search ............ 711/103, 711/113, 154, 156, 161, 162, 170
See application file for complete search history.

(56) References Cited

U.S. PATENT DOCUMENTS

| | | | | |
|---|---|---|---|---|
| 6,715,027 B2* | 3/2004 | Kim et al. | ............ | 711/103 |
| 6,938,116 B2* | 8/2005 | Kim et al. | ............ | 711/103 |
| 6,948,026 B2* | 9/2005 | Keays | ............ | 711/103 |
| 7,149,110 B2* | 12/2006 | Tran et al. | ............ | 365/185.03 |
| 7,304,892 B2* | 12/2007 | Lee | ............ | 365/185.18 |
| 7,451,264 B2* | 11/2008 | Yero | ............ | 711/103 |
| 2002/0116569 A1* | 8/2002 | Kim et al. | ............ | 711/103 |
| 2002/0184436 A1* | 12/2002 | Kim et al. | ............ | 711/103 |
| 2003/0041210 A1* | 2/2003 | Keays | ............ | 711/103 |
| 2003/0101327 A1 | 5/2003 | Beck | | |
| 2005/0251632 A1* | 11/2005 | Hsieh | ............ | 711/154 |
| 2005/0273551 A1* | 12/2005 | Keays | ............ | 711/103 |
| 2007/0121388 A1* | 5/2007 | Lee | ............ | 365/185.29 |
| 2007/0186033 A1* | 8/2007 | Shinagawa et al. | ............ | 711/103 |
| 2008/0082736 A1* | 4/2008 | Chow et al. | ............ | 711/103 |

FOREIGN PATENT DOCUMENTS

| | | |
|---|---|---|
| WO | WO 03/027828 | 4/2003 |
| WO | WO 2004/040585 | 5/2004 |

* cited by examiner

*Primary Examiner*—Jack A Lane
(74) *Attorney, Agent, or Firm*—Trop, Pruner & Hu, P.C.

(57) ABSTRACT

Write operations store data in different physical memory locations. Each of the physical memory locations are associated with a logical address that is shared in common among the physical addresses. Sequence information stored in the physical memory location indicates which one of the write operations occurred last. The available erased memory location can be split into a list of erased memory locations available to be used and a list of erased memory locations not available to be used. Then, on a failure, only the list of erased memory locations available to be used needs to be analyzed to reconstruct the consumption states of memory locations.

23 Claims, 11 Drawing Sheets

RECOVERING FROM A NON-VOLATILE MEMORY FAILURE

BACKGROUND

The invention generally relates to non-volatile memory.

Non-volatile semiconductor memories, such as flash memories, are attractive for applications in which data is to be preserved in the event of a normal system shutdown/hibernation or power failure. Thus, a memory that is formed from flash memory devices may be used to store data in a disk cache or a solid state disk. Although a typical flash memory has a significantly faster access time than a magnetic storage device, unlike the magnetic storage device, the cells of the flash memory typically cannot be re-written without first being erased.

As a more specific example, before a bit of data is stored in a conventional flash memory cell, the cell is first erased. In this erased state, the cell is indicative of a particular logic state, such as a logic "one" state, for example. In a subsequent write operation to the flash memory cell, if a logic one is to be stored in the cell, then the state of the cell remains unchanged. However, if a logic zero is to be stored in the cell, then the cell is programmed to change the cell to a zero logic state. Thus, a typical write to a flash memory cell typically involves two memory operations: a first operation to erase the memory cell; and a second operation to program the logic state of the memory cell. These multiple operations, in turn, contribute to the overall time to write to the flash memory.

DETAILED DESCRIPTION

In accordance with some embodiments, dynamic addressing is used in connection with a non-volatile semiconductor memory for purposes of reducing the write latency of the memory. More specifically, in accordance with some embodiments, the non-volatile memory is, from a software standpoint, addressed using logical addresses. From the standpoint of the physical read and write operations that are performed with the memory, the dynamic addressing translates, or maps, the logical addresses to physical addresses of the memory. The dynamic addressing continually changes the mapping between the logical and physical addresses to ensure that a logical write operation causes data to be stored in a previously erased location (i.e., at a different physical address) of the non-volatile memory. Thus, with dynamic addressing, a logical write operation produces a single operation. This is to be compared to conventional addressing that uses two accesses to non-volatile memory (one to erase/invalidate the old physical location, and the other to write the data at the new pre-erased physical location).

Figure 1:
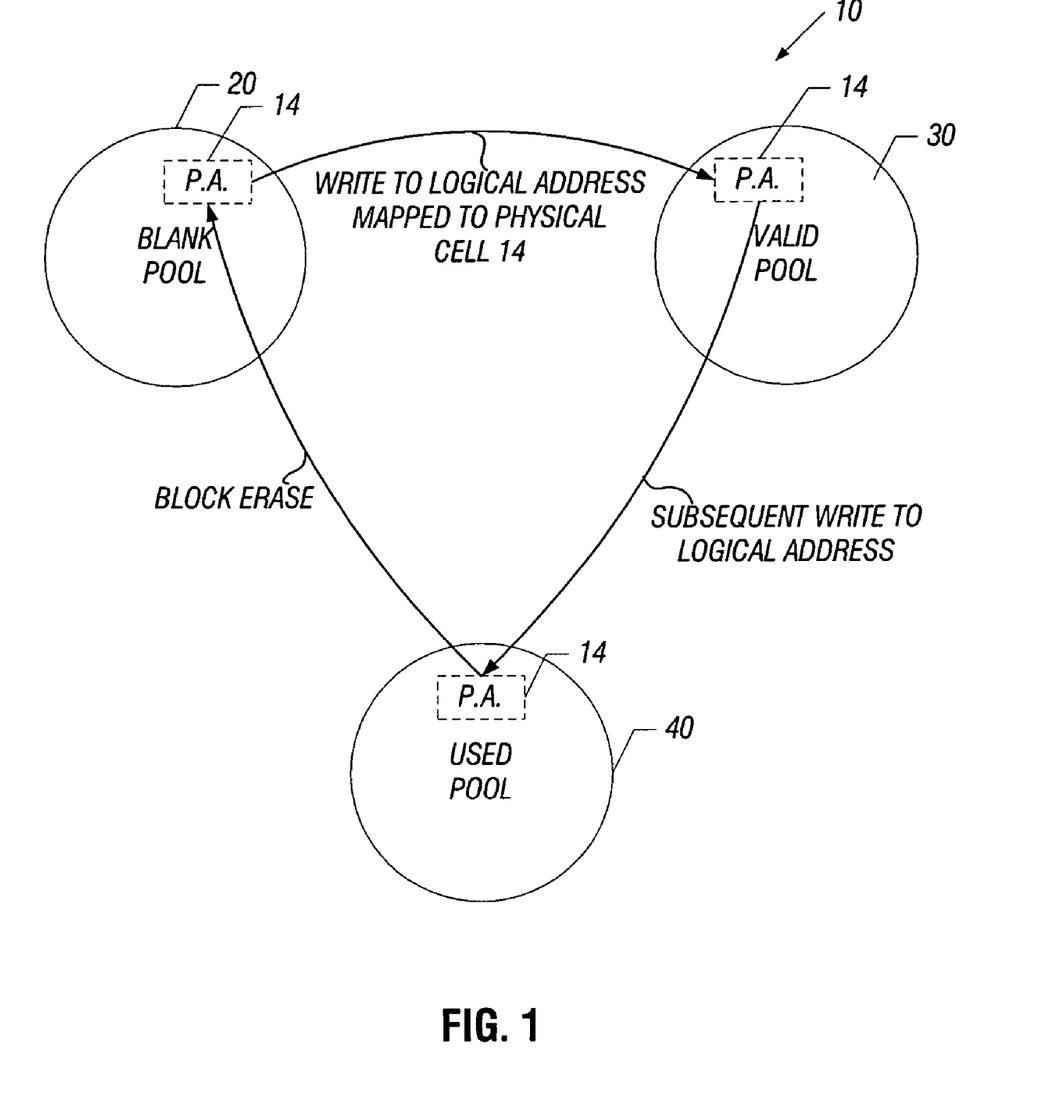
FIG. 1 is an illustration of a dynamic addressing scheme used with a non-volatile semiconductor memory according to an embodiment of the invention.

More specifically, referring to FIG. 1, in accordance with some embodiments, a dynamic addressing scheme 10 groups the physical addresses of a non-volatile memory into blank 20, valid 30, and used 40 pools. The blank pool 20 represents the unassigned physical addresses whose associated memory cells are erased, are ready to be programmed and thus, are ready to be assigned to logical addresses. The valid pool 30 represents physical addresses that are associated with memory cells that store valid data and are assigned to logical addresses. The used pool 40 represents the physical addresses that no longer store valid data, are no longer associated with logical addresses and are to be erased. The physical addresses of the used pool 40 are regrouped into the blank pool 20 when block erase operations are used to erase contiguous blocks (pages, for example) of physical addresses. It is noted that the block erase is more efficient than erasing the physical addresses one at a time in response to each logical write operation, and additionally, the non-volatile memory (such as a NAND flash memory, for example) may only permit block erases.

As a more specific example, an exemplary physical address (P.A.) 14 (associated with a set of memory cells, or memory location) of the non-volatile memory may transition between the blank 20, valid 30 and used 40 pools in the following manner. Initially, such as at startup of the system that incorporates the non-volatile semiconductor memory or after being erased, the physical address 14 belongs to the blank pool 20. In other words, by virtue of being in the blank pool 20, the physical address 14 is available for assignment to a particular logical address. Thus, when data is written to a particular logical address, the physical address 14 is assigned to the logical address so that the data is stored at the physical address 14; and the physical address 14 then becomes part of the valid pool 30. Another write to the physical address 14, however, cannot occur without the memory cells that are associated with the physical address 14 being erased. Therefore, when the next write occurs to the same logical address, another physical address is assigned to the logical address, and the memory content that is associated with the physical address 14 becomes invalid, or "used," as the physical address 14 becomes part of the used pool 40.

The memory cells associated with the physical address 14 are not necessarily immediately erased upon becoming "used," but rather, these memory cells are erased in a block erase operation. At this time, the physical address 14 once again becomes part of the blank pool 20 and may be assigned to another logical address.

Figure 2:
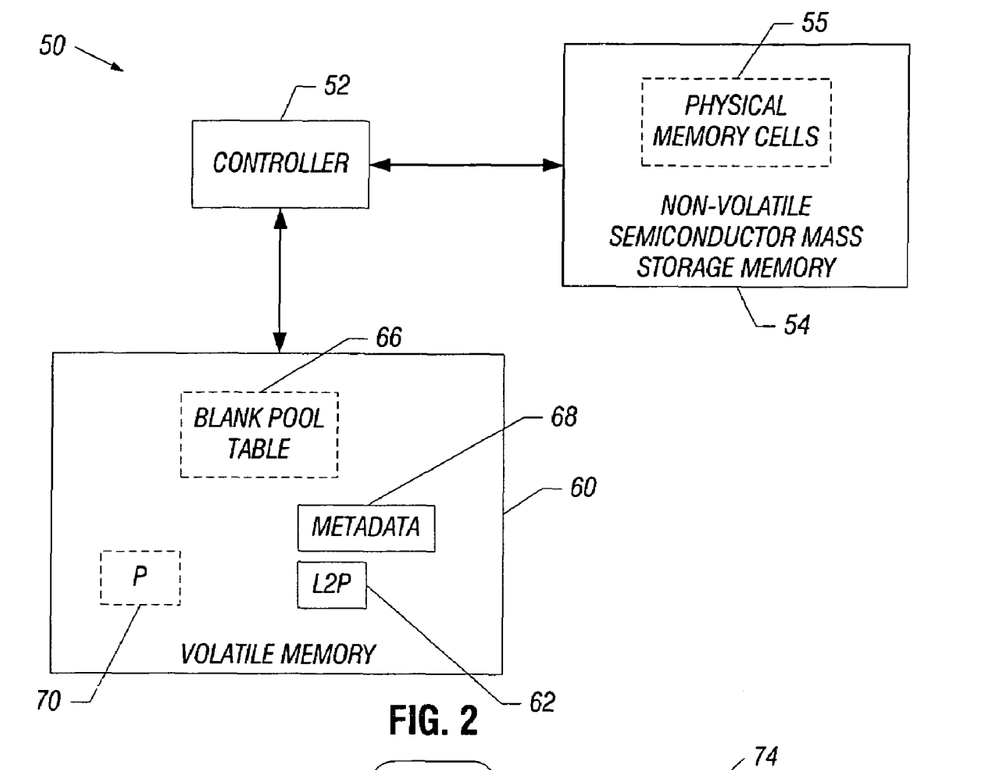
FIG. 2 is a block diagram of a memory system according to an embodiment of the invention.

Referring to FIG. 2, in accordance with some embodiments of the invention, a memory system 50 uses the above-described dynamic addressing scheme 10 and may be used in connection with a non-volatile semiconductor mass storage memory 54 (herein called the "non-volatile memory 54"), such as a flash memory. The non-volatile memory 54 contains an array of physical memory cells 55 that are addressed using physical addresses. In accordance with some embodiments of the invention, a controller 52 of the memory system 50 performs dynamic addressing by converting between logical and physical address spaces. More specifically, in accordance with some embodiments of the invention, the controller 52 is coupled to a volatile memory 60, such as a dynamic random access memory (DRAM), for example. The volatile memory 60 stores a logical-to-physical translation table 62 (herein called a "L2P table"), which the controller 52 uses for purposes of mapping the logical addresses to the physical addresses of the memory 54. This mapping continually changes, and thus, the controller 52 continually updates the L2P table 62 to track the remapping of each logical address to different physical addresses.

As also depicted in FIG. 2, in accordance with some embodiments, the volatile memory 60 stores a blank pool table 66 that indicates which of the physical addresses of the memory 54 are included in the blank pool 20 (see FIG. 1). Thus, when the controller 52 is to perform a write operation to a logical address, the controller 52, in general, selects an available physical address from the blank pool table 66, updates the L2P table 62 to remap the logical address to the selected physical address, and performs the corresponding write operation to the non-volatile memory 54 at the selected physical address.

The volatile memory 60 may also store metadata 68 that contains (among other possible information) information regarding the consumption state of the memory content that is stored at each physical address. In accordance with some embodiments of the invention, for each addressable location of the non-volatile memory 54, the metadata 68 indicates whether the data content that is stored in the location is used, valid or blank. In addition to the blank pool table 66, L2P table 62 and the metadata 68, the volatile memory 60 may store program instructions in a computer accessible medium 70 that, when executed, cause the controller 52 to perform one or more of the physical write, address translation and failure recovery techniques that are disclosed herein.

Thus, to summarize, the controller 52 uses the volatile memory 60 to store information that is indicative of the logical-to-physical address mapping and indicative of the states of the addressable memory locations of the non-volatile memory 54. It may be advantageous to store such information in the volatile memory 60, as compared to a non-volatile memory (such as the memory 54), due to the relatively faster access times to the volatile memory 60, given the high number of accesses used to maintain this information. The volatile information may be stored to non-volatile memory at key events, e.g., shutdown, hibernate, suspend, low power detection, etc., and restored therefrom on subsequent reboot/resume. However, in general, a potential challenge with this technique is that the information that is stored in the volatile memory 60 is lost in the event of a failure, such as a power failure or crash, to the memory system 50. Although periodic back-up of the contents of the volatile memory 60 may be made, these back-ups may be insufficient, by themselves, to recover the lost information. Therefore, upon recovery from a failure, the controller 52 would be unaware of the logical-to-physical mapping and the consumption states of the various addressable memory locations of the volatile memory 54 and thus, would be unable to reconstruct the information that was stored in the volatile memory 60.

In accordance with some embodiments, the controller 52 performs a single (instead of two, for example) write operation to the non-volatile memory 54 for a logical write operation. To permit recovery of the information (such as the information that is stored in the L2P table 62 and the blank pool table 66, for example) that is stored in the volatile memory 60 after a failure, the controller 52, in each physical write operation, stores a sequence information, such as a time stamp or sequence number, in the non-volatile memory 54. More specifically, in accordance with some embodiments of the invention, the controller 52 generates a global sequence number for each write operation to the non-volatile memory 54. The controller 52 increments the global sequence number for each write operation so that the sequence number has an increasing value (for example) for the write operations. As described below, the sequence numbers are used by the controller 52 after a failure to reconstruct the timeline of prior write operations (occurring before the failure) to determine which addressable locations of the non-volatile memory 54 store valid data (and thus, also to determine which locations store used data).

Figure 3A:
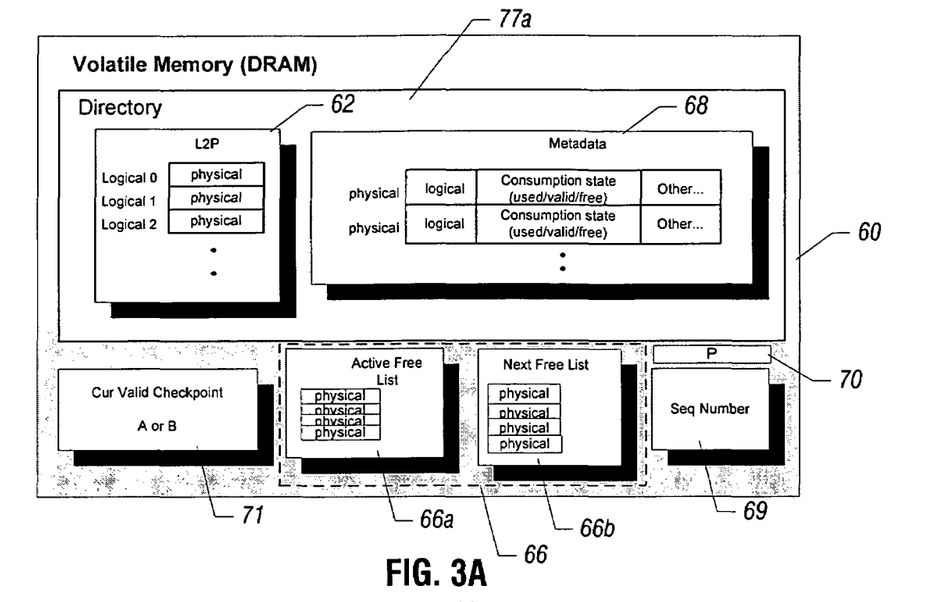
FIGS. 3A and 3B are depictions of volatile and non-volatile memory space in accordance with embodiments of the present invention.

FIG. 3A is a more detailed depiction of the volatile memory 60. Volatile memory 60 includes a directory 77a which includes the logical-to-physical translation table 62 and metadata 68. The logical-to-physical translation table provides the correspondence between logical addresses, such as logical addresses 0-2, and the corresponding physical addresses.

The metadata table 68 provides the correspondence between physical addresses, logical addresses, and the consumption state, be it used, valid, or free, as well as other information.

The volatile memory 60 also includes a current valid checkpoint register 71 that indicates which of two non-volatile memory stored checkpoints (A or B) is currently valid. A checkpoint stores, in the non-volatile memory 54, the directory 77a and metadata 68 as they exist at a certain time frame. The blank pool table 66 includes a list of the active free memory locations, called the active free list 66a, that are available for active use since they have been erased. Also provided, as part of the blank pool table 66, is a similar list of the free locations to be accessed next, labeled next free list 66b, in FIG. 3A. A sequence number is stored in the volatile memory 60 in the register 69. A sequence number is provided for each transaction in a consecutive fashion. In some embodiments, a set of instructions stored in a storage 70 may be executed to implement various embodiments of the present invention.

Figure 3B:
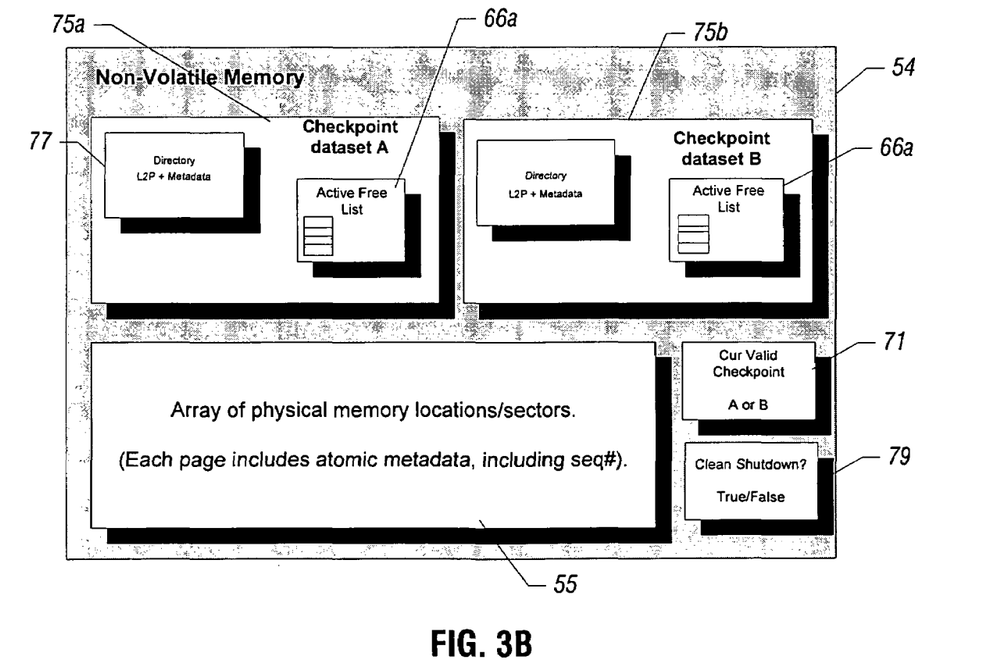

Referring to FIG. 3B, the non-volatile memory 54 includes the actual checkpoint data set storage locations 75a and 75b. As mentioned previously, the volatile memory 60 indicates which of those checkpoints, either A or B, is valid in register 71. Each checkpoint stores the directory 77a and the active free list 66a for a given checkpoint as it existed in volatile memory at a certain point in time. A current valid checkpoint indicator is also stored in the non-volatile memory in the register 71 and a flag is stored at 79, indicating whether or not a system shutdown was "clean" or, instead, was the result of a failure. Finally, an array 55 of physical locations or sectors is provided. Each page may include atomic metadata including the sequence number.

The two checkpoint data set storage locations 75a and 75b contain copies of the directory 77a and the active free list 66a. There are two such areas, so that when preparing a new checkpoint, the erase operation before the write does not erase the only valid checkpoint. The latest checkpoint is preserved while the older checkpoint is erased. Then, the information about which of the two checkpoints is valid is stored in the current valid checkpoint location 71 in the volatile memory 60 and the non-volatile memory 54. For example, the use of two checkpoints is advantageous in case a failure occurs while updating a checkpoint.

The sequence numbers are part of atomic metadata that may be incremented on every write to the non-volatile memory during run time. Therefore, the directory 77 can be reconstructed if needed, by just reading all the metadata in the array and by understanding the sequence of writes. Sequence numbers are used, but checkpoint copies of the directory and the active free list are made in addition, according to the techniques described herein. The checkpoint copies serve as a starting point for the recovery and the active free list shows every page that has been potentially written since the checkpoint was last updated. Therefore, only the metadata with the sequence numbers associated with the page and the active free list need to be inspected to reconstruct completely the directory. Neither the entire memory, or even the entire blank pool table 66, need be read, and, therefore, recovery is faster. For example, there is no need to check the next free list 66b since by definition these locations have not been used since the last checkpoint update.

Checkpoints are taken whenever the active free list shrinks below a threshold of free locations available for use. The time between checkpoints, how much memory must be read to recover, and, therefore, how long it takes to recover is a function of how many entries are in the active free list and what the threshold is set to. The threshold should not be too low as time is taken to create a new checkpoint. If the active free list 66a is empty, further operation of the device may need to wait until the new checkpoint is complete.

Figure 4:
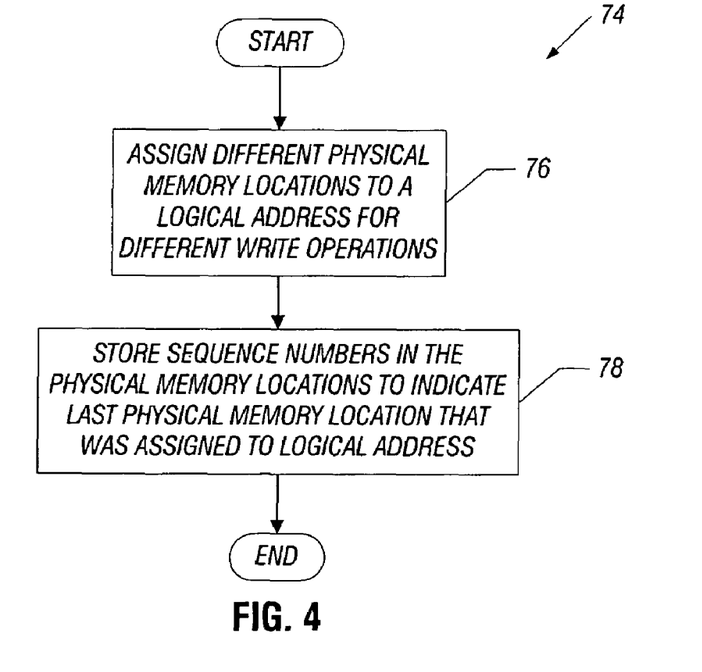
FIG. 4 is a flow diagram depicting a technique used in connection with a write operation to a non-volatile semiconductor memory according to different embodiments of the invention.

Referring to FIG. 4, in accordance with some embodiments of the invention, the controller 52 performs a technique 74 in connection with logical write operations. Pursuant to the technique 74, the controller 52 assigns (block 76) different physical memory locations to a logical address for different write operations. Thus, for a first write operation to a particular logical address, the controller 52 writes to a first physical address of the non-volatile memory 54; and for the next write operation to this logical address, the controller 52 writes to a second physical address of the non-volatile memory 54. Pursuant to the technique 74, the controller 52 stores (block 78) sequence numbers and logical addresses in the physical memory locations that collectively indicate the last physical memory location that was assigned to the logical address. As discussed above, the sequence numbers permit the controller 52 to rebuild the information in the volatile memory 60 after the occurrence of a failure.

Figure 5:
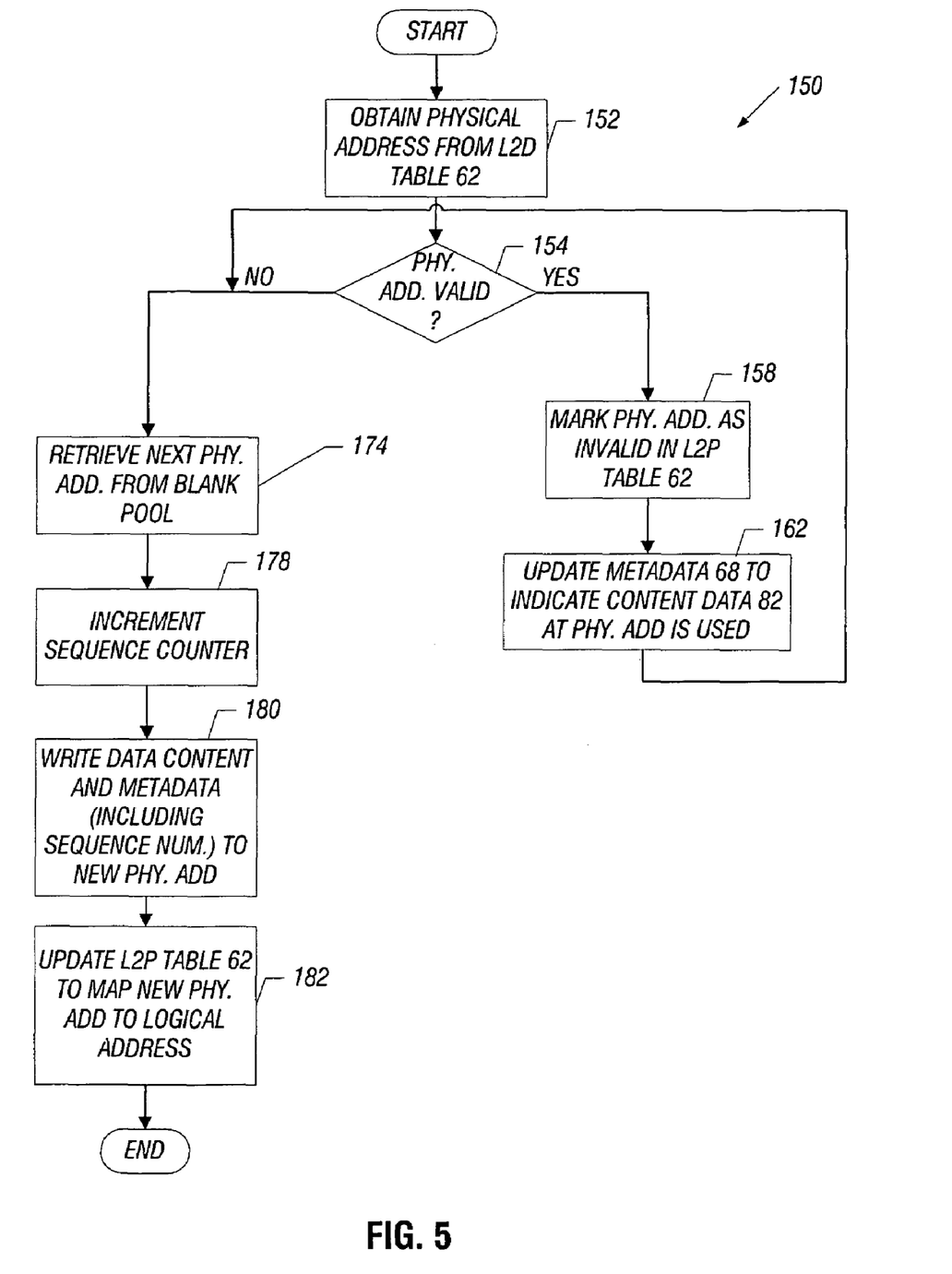
FIG. 5 is a flow diagram depicting a technique used in connection with a write operation to a non-volatile semiconductor memory according to different embodiments of the invention.

Referring to FIG. 5, the controller 52 (see FIG. 2) may perform a technique 150 in response to a logical write operation. The logical write operation targets a logical address and indicates data to be stored at the logical address. Pursuant to the technique 150, the controller 52 obtains a physical address for the logical address, such as by using the logical address to look up the particular physical address from the L2P table 62 (see FIG. 2), as depicted in block 152. The controller 52 then determines (diamond 154) whether the physical address is valid. This is quite often the case during normal operation, although a particular physical address may be associated with the blank pool after initial power up of the memory system 50 (see FIG. 2).

If the controller 52 determines (diamond 154) that the current physical address is valid, the controller 52 marks (block 158) the current physical address as invalid in the L2P table 62. Thus, if the current physical address currently stores valid data, pursuant to the dynamic addressing scheme discussed herein, another physical address is used (as described further below) to store the data that is the subject of the current logical write operation. Next, the controller 52 updates (block 162) the volatile metadata 68 to indicate that the content data 82 (see FIGS. 2 and 4) at the current physical address.

Either after block 162 or after determining (diamond 154) that the current physical address is invalid, the controller 52 retrieves (block 174) the next physical address from the blank pool 20 (to replace the current physical address) and increments (block 178) a sequence counter. It is assumed for the embodiment discussed in connection with FIG. 5 that a global sequence counter is used. However, as discussed above, a separate local sequence counter may be used for each logical address, in accordance with other embodiments of the invention.

The controller 52 then writes (block 180) the content and metadata (which includes the sequence number and logical address) to the new physical address. Subsequently, the controller 52 updates (block 182) the L2P table 62 to map, or assign, the new physical address to the logical address.

Figure 6:
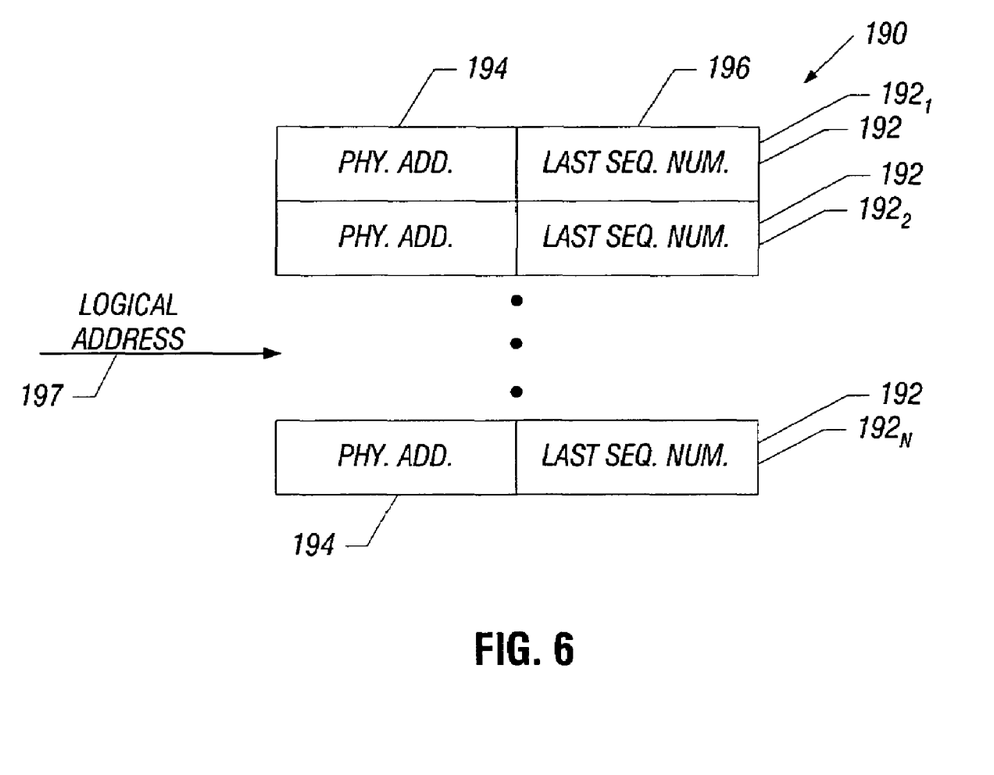
FIG. 6 is an illustration of an intermediate table used to reconstruct the logical-to-physical translation table after a power failure according to an embodiment of the invention.

For purposes of reconstructing the L2P table 62 after a failure, the controller 52 uses a temporary table 190, an exemplary embodiment of which is depicted in FIG. 6. The table 190 includes N two tuple entries 192 (entries $192_1$, $192_2$, ... $192_N$, depicted as examples), each of which is associated with a particular logical address. Thus, the controller 52 may use a logical address pointer 197 for purposes of looking up a particular entry 192. In accordance with some embodiments of the invention, each entry 192 includes a field 194 that indicates a physical address for the logical address and a field 196 that indicates the last (and largest) sequence number that has been found so far. Therefore, the controller 52 updates the entries 192 as the controller 52 scans through the non-volatile memory 54 (after a failure) so that at the end of the scan, each entry 192 indicates the most recently used physical address for each logical address (i.e., the physical address having the highest sequence number).

Figure 7:
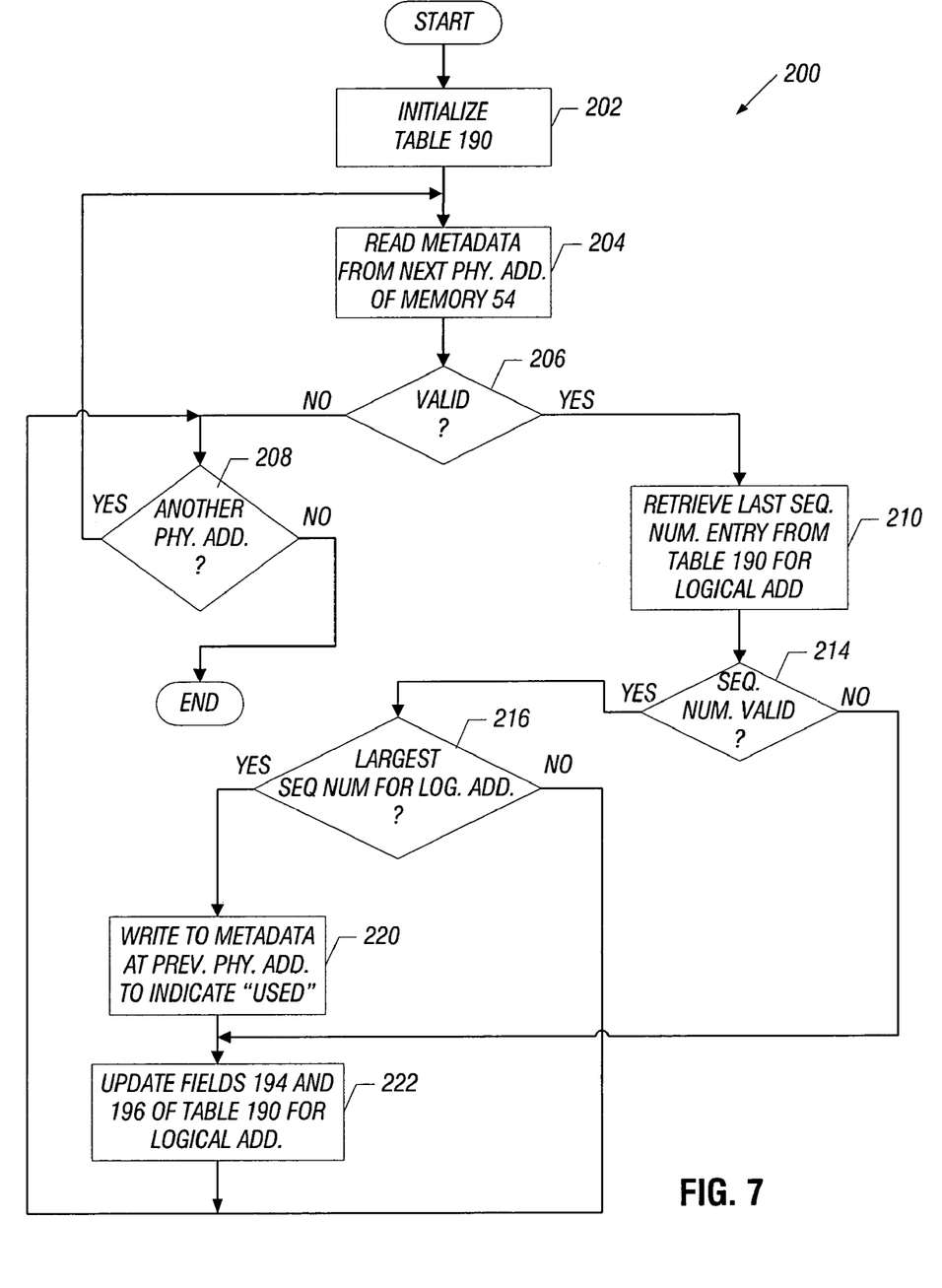
FIG. 7 is a flow diagram depicting a technique to reconstruct the logical-to-physical translation table after a power failure according to an embodiment of the invention.

As a more specific example of the use of the table 190, in accordance with some embodiments of the invention, the controller 52 generally performs a technique 200 that is depicted in FIG. 7. Pursuant to the technique 200, the controller 52 initializes (202) the table 190. For example, this initialization may include storing values (such as a "−1," for example) in each entry 192 (of the table 190) that do not correspond to a physical address or last sequence number, to indicate the initialized status of the entry 192. The controller 52 next reads (block 204) metadata from the next physical address of the non-volatile memory 54. If the metadata indicates that memory content is invalid (diamond 206), then the controller 52 determines (diamond 208) whether there is another physical address to process and if so, returns to block 204. Blank pool and used pool reconstruction may be done in the same pass, in accordance with some embodiments of the invention.

If the controller 52 determines (diamond 206) that the content data is valid, then the controller 52 retrieves (block 210) the last sequence number entry from the table 190 for the particular logical address that is associated with that physical address. Thus, an indication of this logical address is stored in the memory location of the non-volatile memory 54. If the controller 52 determines (diamond 214) that the sequence number is valid (i.e., the controller 52 determines that the sequence number is not the initialized value), then the controller 52 determines (diamond 216) whether the current sequence number is the largest sequence number for the logical address so far. If not, then control returns to diamond 208. Otherwise, the last physical address used for the logical address (as indicated so far in the scan) has been located, and the controller 52 writes (block 220) to the metadata at the previous physical address to indicate that the corresponding content data is "used." Subsequently, the controller 52 updates (block 222) the fields 194 and 196 (see FIG. 6) of the table 190 for the corresponding logical address. Control then proceeds to diamond 208 in which the controller 52 determines whether another physical address is to be processed. If not, then the controller 52 has completed the scan, and the table 190 has been constructed. It is noted that absent the entries 196 (see FIG. 6) the table 190 constitutes the reconstructed L2P table 62. Thus, in accordance with some embodiments of the invention, the controller 52 may extract the data 194 at the conclusion of the scan to reconstruct the L2P table 62.

Figure 8:
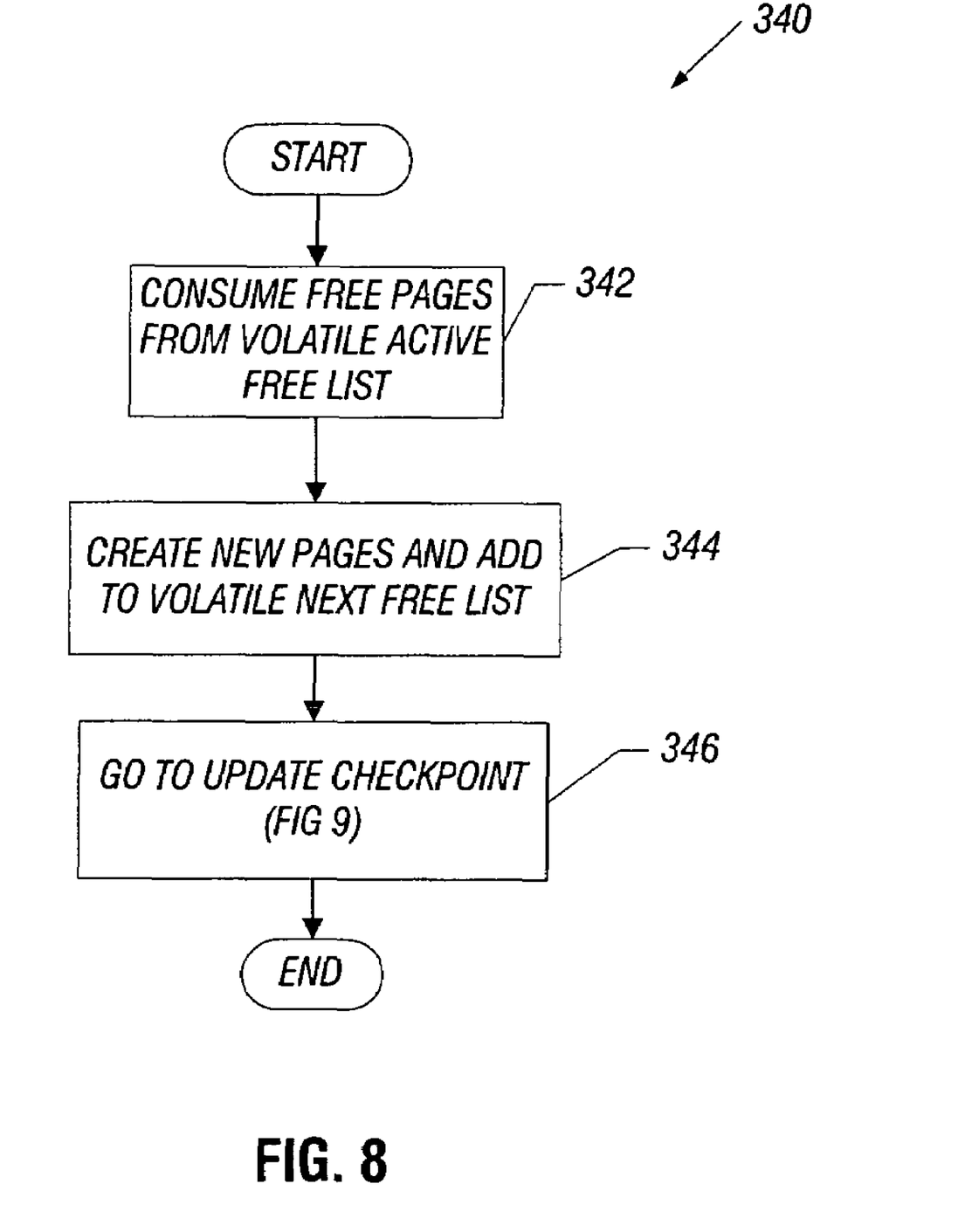
FIG. 8 is a flow diagram depicting steady state operation of one embodiment.

Steady state operation of one embodiment of the present invention is depicted in FIG. 8. There, the process 340 begins by consuming free pages from the volatile active free list 66a as indicated in block 342. New pages are created and those new added pages are added to the volatile next free list 66b as indicated in block 344.

Finally, in block 346, the checkpoint update process 300 (FIG. 9) is called.

Figure 9:
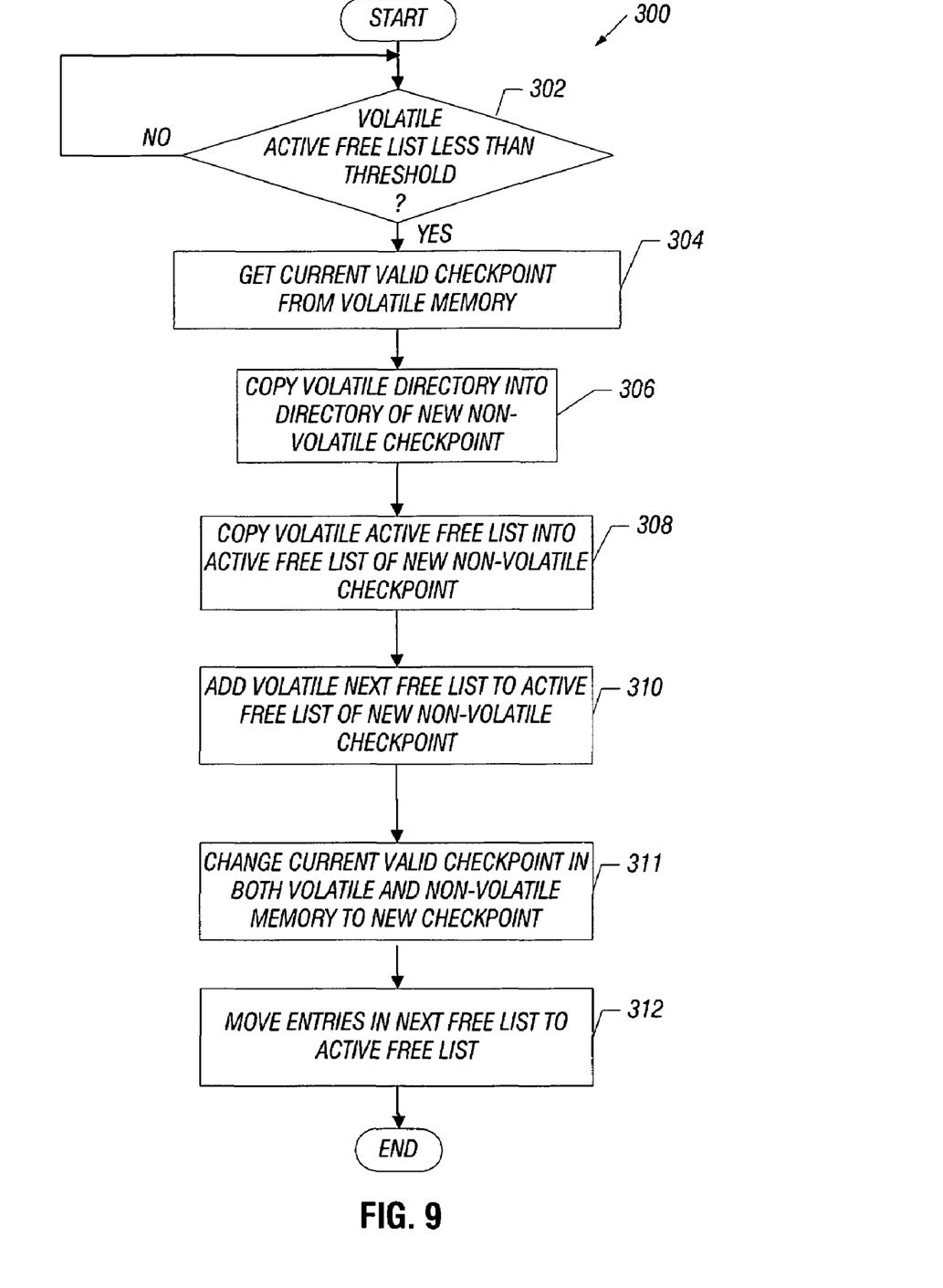
FIG. 9 is a flow diagram depicting a technique for updating the checkpoint according to one embodiment.

Referring to FIG. 9, the checkpoint update process 300 begins by determining whether the volatile active free list is less than a threshold. If so, it is desirable to increase the number of locations in the active free list so that there is no chance that sufficient locations would not be available without building another checkpoint update while the system waits for the new checkpoint.

To update the active free list, the current valid checkpoint is obtained from the volatile memory register 71 (FIG. 3A) as indicated in block 304. In other words, it is determined which of the checkpoints A or B is the current valid checkpoint. The volatile directory 77a (FIG. 3A) from the current valid checkpoint is then copied into the directory of a new non-volatile checkpoint as indicated in block 306. Then, the volatile active free list is copied into the active free list of the new non-volatile checklist as indicated in block 308.

Thereafter, the volatile next free list is added to the active free list of the new non-volatile checkpoint as indicated in block 310. Thereafter, the current valid checkpoint in both the volatile and non-volatile memory is changed to the new checkpoint as indicated in block 311. Finally, the entries in the next free list are moved to the active free list as indicated in block 312.

Figure 10:
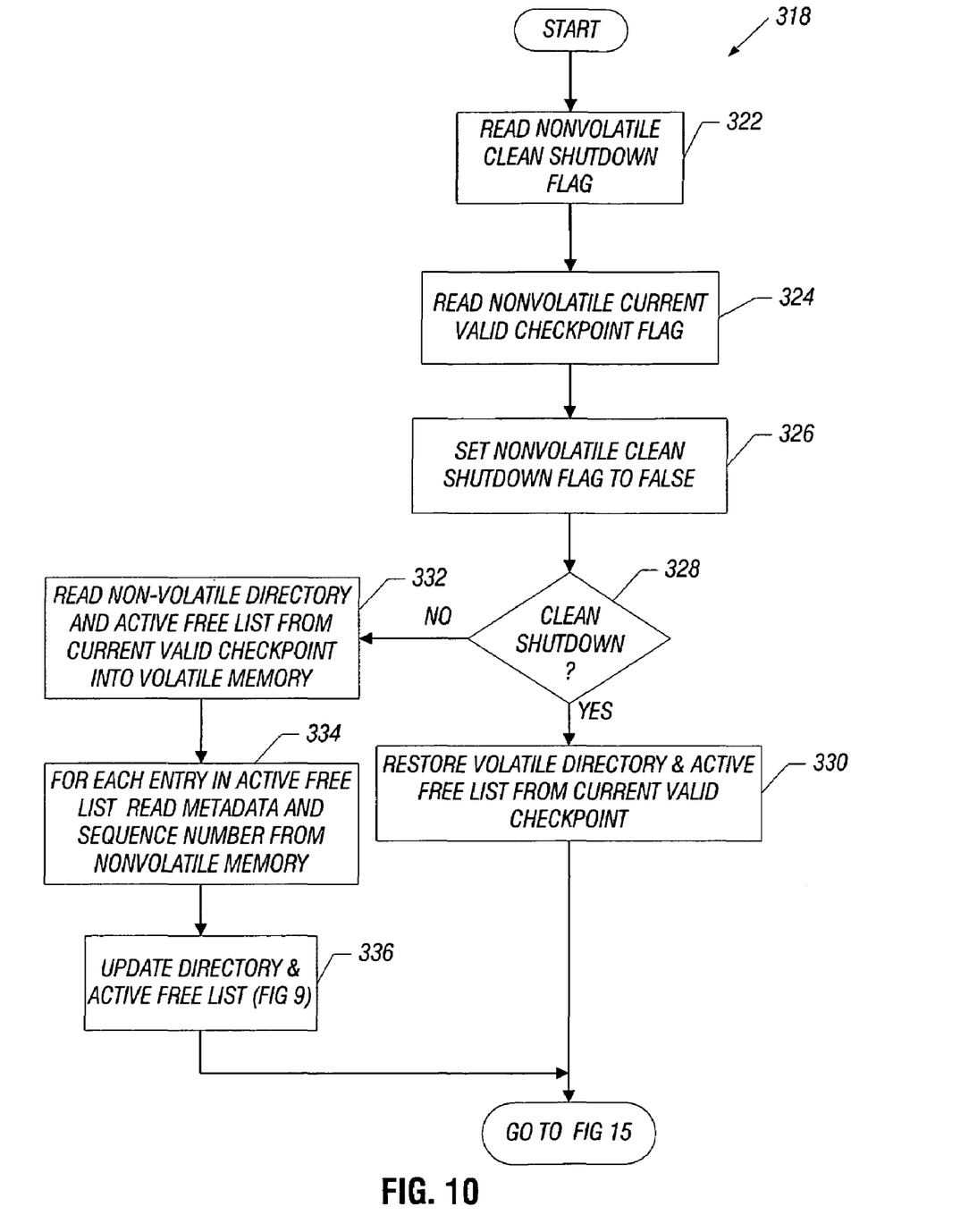
FIG. 10 is a flow diagram for start up according to one embodiment.

Turning now to FIG. 10, the startup process 318 begins by reading the non-volatile clean shutdown flag (from register 79 in FIG. 3B) as indicated in block 322. Also, the non-volatile current valid checkpoint flag (from register 71 in FIG. 3B) is read in block 324. The non-volatile clean shutdown flag is set to false in block 326, just in case there is a failure in the course of running the startup process 318. Then, a check at diamond 328 determines whether the last shutdown before the startup was a clean shutdown. A clean shutdown is one in which there was not a failure and in which there was time to transfer the settings from the volatile to the non-volatile memory. If a clean shutdown was detected in diamond 328, then the volatile directory is restored from the stored non-volatile directory and the active free list is restored from the current valid checkpoint as indicated in block 330.

However, if a clean shutdown did not occur, then the non-volatile directory and the active free list are read from the current valid checkpoint into volatile memory as indicated in block 332. Then, the task begins of updating the last available directory and metadata. In block 334, for each entry in the active free list, the metadata and sequence number is read from the non-volatile memory. Only the active free list entries must be considered. Those entries in the next free list were not used by definition and, therefore, need not be utilized in the course of resurrecting the directory. This may save considerable time. Finally, the directory and the active free list are updated, as indicated in block 336, by proceeding as indicated in the process 300 (FIG. 9).

Figure 11:
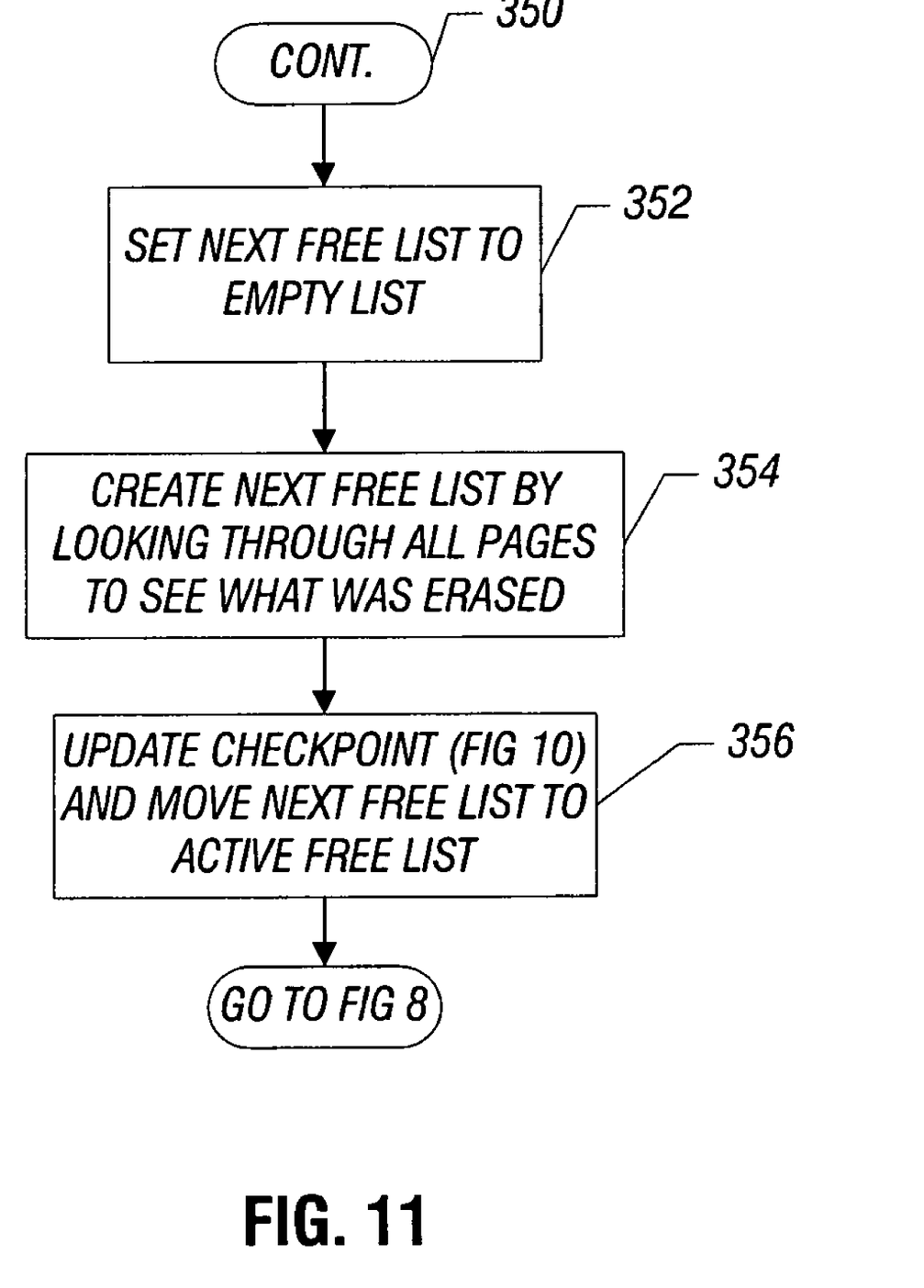
FIG. 11 is a continuation of the FIG. 10 flow diagram.

Turning now to FIG. 11, in the process 350, the flow continues by setting the next free list to empty, initializing the next free list, as indicated in block 352. The next free list is created by looking through all of the pages to see what was erased, in block 354. The checkpoint is updated, using the process 318 of FIG. 10, and the next free list is moved to the active free list in block 356. Then, the steady state process 340 is resumed.

Figure 12:
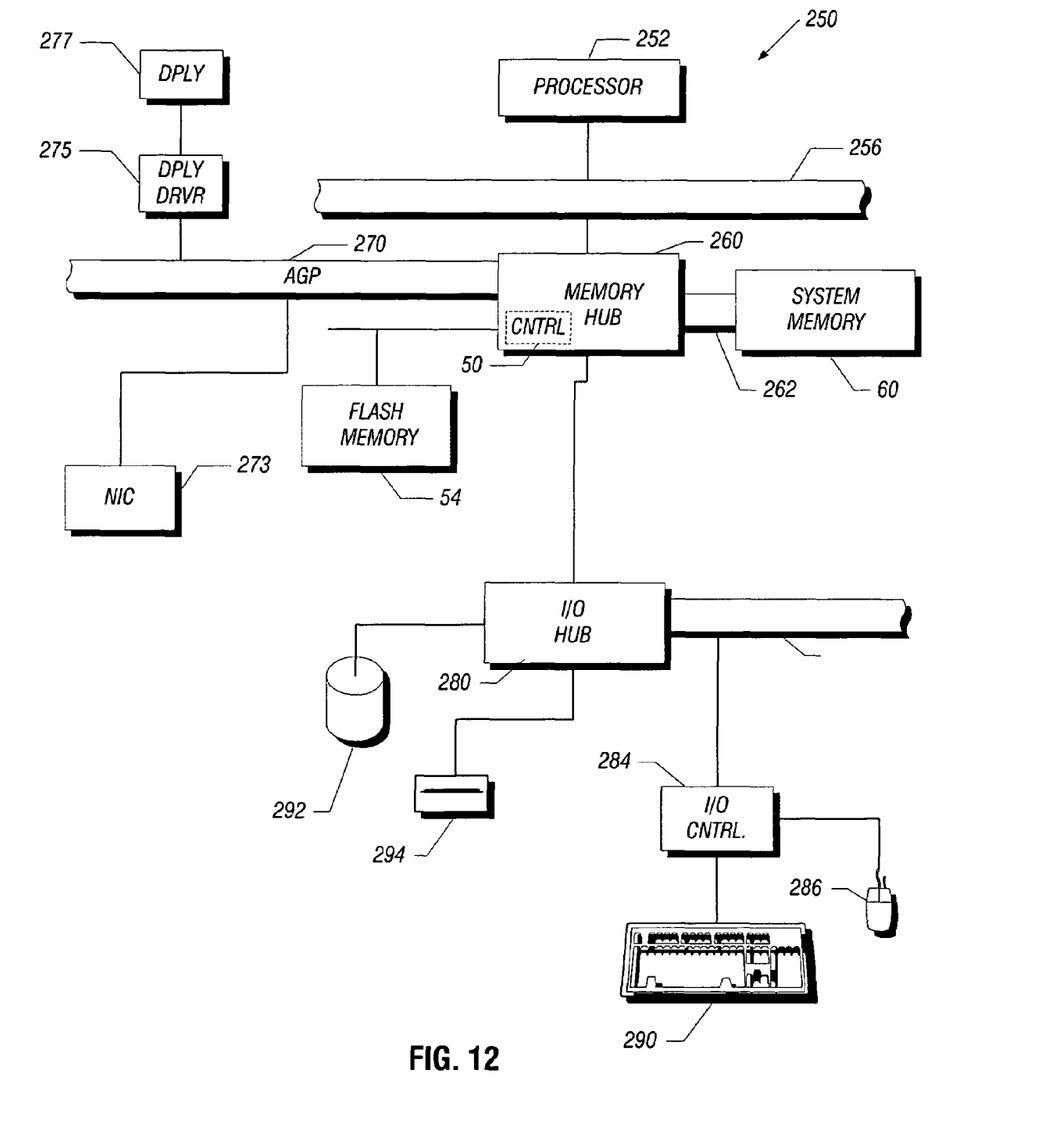
FIG. 12 is a block diagram of a computer system according to an embodiment of the invention.

The memory system 50 (see FIG. 2) may be used in a variety of different applications and thus, many different embodiments of the invention are possible and are within the scope of the appended claims. For example, in accordance with some embodiments of the invention, the memory system 50 may be a solid state disk, and in other embodiments of the invention, the memory system 50 may be a disk cache or a cache for multiple disks or RAID volumes. FIG. 12 depicts an exemplary embodiment of a computer architecture 250 that incorporates the memory system 50. The computer architecture 250 may be used in a desktop or laptop computer, as examples.

The computer system 250 includes a processor 252 (one or more microprocessors, for example) that is coupled to a system bus 256. The computer system 250 may also include a north bridge, or memory hub 260, that is coupled to the system bus 256 for purposes of establishing communication between the processor 252 and a system memory, such as a dynamic random access memory (DRAM) 60. In accordance with some embodiments of the invention, the DRAM 60 is an embodiment of the volatile memory 60, although other volatile memories may be used in other embodiments of the invention. The DRAM 60 may be coupled to the memory hub 260 via a memory bus 262. The memory hub 260 may include the controller 52 in some embodiments of the invention, although the controller 52 may be separate from the memory hub 260, in other embodiments of the invention.

As depicted in FIG. 12, in accordance with some embodiments of the invention, the non-volatile memory may be a NAND flash memory, although other types of non-volatile memory may be used in its place, in accordance with other embodiments of the invention. For example, in other embodiments of the invention, a ferroelectric polymer memory may be used in place of the NAND flash memory.

The memory hub 260 may interface other buses to the system bus 256, such as a Peripheral Component Interconnect (PCI) bus 272 and an Accelerated Graphics Port (AGP) bus 270, in some embodiments of the invention. The PCI Specification is available from The PCI Special Interest Group, Portland, Oreg. 97214. The AGP is described in detail in the Accelerated Graphics Port Interface Specification, Revision 1.0, published on Jul. 31, 1996, by Intel Corporation of Santa Clara, Calif. The PCI bus 272 may couple, for example, a network interface card (NIC) 273 to the PCI bus 272; and the AGP bus 270 may couple, for example, a display driver 275 that drives a display 277 to the system bus 256.

As depicted in FIG. 14, in accordance with some embodiments of the invention, the memory hub 260 may be coupled to a south bridge, or an input/output (I/O) hub 280. The I/O hub 280 may provide interfaces for a CD-ROM drive 294 and a hard disk drive 292, as examples. Furthermore, the I/O hub 280 may provide an interface for an I/O expansion bus 282.

An I/O controller 284 may be coupled to the I/O expansion bus 282 and may receive input data from a mouse 286 and a keyboard 290.

It is noted that the architecture that is depicted in FIG. 12 is merely for purposes of example, as other variations are possible and are within the scope of the appended claims. In some embodiments of the present invention, processes described herein, including the process 74, the process 150, the process 200, the process 300, the process 318, the process 340, and the process 350 may be implemented in hardware, software, or firmware. In some embodiments, implemented in software, processes may constitute instructions that may be stored in a computer-readable or computer accessible memory. That memory may be a magnetic or semiconductor memory. Examples of suitable memories are extremely varied and include flash memories, disk drives, hard disk drives, optical memories, read only memories, and randomly accessible memories, as examples. For example, referring to FIG. 12, such memories can include the system memory 60, flash memory 54, magnetic memory 292, and optical memory 294.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   storing a checkpoint of the consumption status of memory locations;
   storing a first list of entirely erased memory locations available to be used, said list excluding erased memory locations erased since the storage of said checkpoint; and
   storing a second list of entirely erased memory locations not available to be used because they were erased since the storage of said checkpoint, said first and second lists being separate lists.

2. The method of claim 1 comprising:
   performing a plurality of write operations to store data in different physical memory locations, each of the physical memory locations being associated with a logical address shared in common among the physical memory locations; and
   storing sequence information in the physical memory locations to indicate which one of the write operations occurred last.

3. The method of claim 2, further comprising:
   storing the logical address in the physical memory locations to indicate which one of the write operations occurred last.

4. The method of claim 2, wherein the physical memory locations are part of a non-volatile memory, the method further comprising:
   in response to each of the write operations, updating a logical-to-physical address translation table indicative of a mapping between the logical address and one of the physical memory locations.

5. The method of claim 2, further comprising:
   in response to a failure, using the sequence information to reconstruct a logical-to-physical translation table indicative of a mapping between the logical address and one of the physical memory locations.

6. The method of claim 5, further comprising:
   in response to a failure, using the sequence information to determine which of the physical memory locations do not store valid data for the logical address.

7. The method of claim 1 including periodically developing a checkpoint indicating the consumption status of memory locations.

8. The method of claim 7 including updating said checkpoint when the number of erased memory locations available to be used falls below a threshold.

9. The method of claim 7 including a response to a failure, reconstructing the consumption status of memory locations using said checkpoint and said list of erased memory locations available to be used.

10. The method of claim 9 including, in the course of updating said checkpoint, transferring locations from said list of erased memory locations not available to be used to said list of memory locations available to be used.

11. The method of claim 10 including maintaining duplicate checkpoints.

12. An apparatus comprising:
    a controller;
    a volatile memory coupled to said controller;
    a non-volatile memory array coupled to said controller; and
    a first non-volatile memory location to store a checkpoint of the consumption status of memory locations and a list of erased memory locations available to be used, said list excluding erased memory locations erased since the storage of said checkpoint, and a second list of entirely erased memory locations not available to be used because they were erased since the storage of said checkpoint, said first and second lists being separate lists.

13. The apparatus of claim 12, said controller, in response to failure, to use sequence information to reconstruct a logical-to-physical translation table indicative of the mapping between a logical address and a physical memory location in said non-volatile memory array.

14. The apparatus of claim 13, said controller, in response to a failure, to use the sequence information to determine which of the physical memory locations do not store valid data for the logical address.

15. The apparatus of claim 12, said controller to periodically develop a checkpoint indicating the consumption status of memory locations in said non-volatile memory array.

16. The apparatus of claim 15, said controller to update said checkpoint when the number of erased memory locations available to be used falls below a threshold.

17. The apparatus of claim 15, said controller, in response to a failure, to reconstruct the consumption status of memory locations using said checkpoint and said list of erased memory locations available to be used.

18. The apparatus of claim 17, said controller, in the course of updating said checkpoint, to transfer locations from a list of erased memory locations not available to be used to said list of erased memory locations available to be used.

19. The apparatus of claim 18, said controller to maintain duplicate checkpoints in said non-volatile memory array.

20. The apparatus of claim 19 including a storage to store an indicator to indicate a valid checkpoint of said duplicate checkpoints.

21. A computer readable storage medium storing instructions that, when executed, enable a processor-based system to:
- store a checkpoint of the consumption status of memory locations;
- store a first list of entirely erased memory locations available to be used, said list excluding erased memory locations erased since the storage of said checkpoint, and
- store a second list of entirely erased memory locations not available to be used because they were erased since the storage of said checkpoint, said first and second lists being separate lists.

22. The medium of claim 21 further storing instructions that, when executed, enable the processor-based system, in response to a failure, to use sequence information to reconstruct a logical-to-physical translation table indicative of the mapping between logical address and a physical memory location.

23. The medium of claim 21 further storing instructions that, when executed, enable the processor-based system, in response to a failure, to reconstruct said logical-to-physical translation table using said list of erased memory locations available to be used and not using said list of erased memory locations not available to be used.

* * * * *